US 6,678,162 B2

(12) United States Patent
Chewning

(10) Patent No.: US 6,678,162 B2
(45) Date of Patent: Jan. 13, 2004

(54) INTERLOCK FOR BLIND DOCK CARTRIDGE

(75) Inventor: Patrick W. Chewning, Beaverton, OR (US)

(73) Assignee: International Business Machines Corporation, Armonk, NY (US)

(*) Notice: Subject to any disclaimer, the term of this patent is extended or adjusted under 35 U.S.C. 154(b) by 96 days.

(21) Appl. No.: 10/041,290

(22) Filed: Jan. 7, 2002

(65) Prior Publication Data
US 2003/0128527 A1 Jul. 10, 2003

(51) Int. Cl.[7] .................................................. G06F 1/16
(52) U.S. Cl. ...................... 361/726; 361/683; 361/685; 312/208.4; 174/35 R
(58) Field of Search .................... 361/58, 170, 682, 361/683, 724–729, 732, 749, 752–754; 200/292, 322; 235/476; 292/207; 307/25, 33, 65, 113, 117, 134; 713/324; 312/208.4, 324; 379/88.2, 142.11; 710/301, 302, 306; 370/386, 396; 330/129, 295, 298; 174/35 R, 72 A, 135, 48, 422, 261

(56) References Cited

U.S. PATENT DOCUMENTS

| 4,071,722 A | * | 1/1978 | Hart ........................... 200/50.1 |
| 4,835,737 A | * | 5/1989 | Herrig et al. ................ 710/302 |
| 4,999,787 A | | 3/1991 | McNally et al. |
| 5,157,771 A | | 10/1992 | Losi et al. |
| 5,210,855 A | | 5/1993 | Bartol |
| 5,310,998 A | * | 5/1994 | Okuno ......................... 235/380 |
| 5,317,697 A | | 5/1994 | Husak et al. |
| 5,373,133 A | * | 12/1994 | Brockway et al. .......... 200/335 |
| 5,386,567 A | | 1/1995 | Lien et al. |
| 5,418,404 A | * | 5/1995 | Araoka et al. ............... 307/142 |
| 5,473,499 A | | 12/1995 | Weir |
| 5,483,419 A | * | 1/1996 | Kaczeus, Sr. et al. ....... 361/685 |
| 5,530,302 A | | 6/1996 | Hamre et al. |
| 5,568,610 A | | 10/1996 | Brown |
| 5,625,238 A | | 4/1997 | Ady et al. |
| 5,664,119 A | | 9/1997 | Jeffries et al. |
| 5,764,926 A | | 6/1998 | Fukuda et al. |
| 5,796,185 A | | 8/1998 | Takata et al. |
| 5,805,903 A | | 9/1998 | Elkhoury |
| 5,862,350 A | | 1/1999 | Coulson |
| 5,881,251 A | | 3/1999 | Fung et al. |
| 5,898,844 A | | 4/1999 | Thompson |
| 5,983,298 A | | 11/1999 | Schultz et al. |
| 6,069,796 A | | 5/2000 | Hastings et al. |
| 6,105,090 A | * | 8/2000 | Fosmo ........................ 710/302 |
| 6,125,417 A | * | 9/2000 | Bailis et al. ................. 710/302 |
| 6,138,194 A | | 10/2000 | Klein et al. |
| 6,182,173 B1 | | 1/2001 | Grosser et al. |
| 6,232,676 B1 | * | 5/2001 | Kozuga et al. .............. 307/113 |
| 6,310,777 B1 | * | 10/2001 | Knott .......................... 361/726 |
| 6,491,226 B1 | * | 12/2002 | Nishioka ..................... 235/475 |

OTHER PUBLICATIONS

"AL460 GX MP Server System Product Guide", pp. 65–70.

* cited by examiner

Primary Examiner—Michael Datskovsky
(74) Attorney, Agent, or Firm—Lieberman & Brandsdorfer, LLC

(57) ABSTRACT

An interlock enables power to a computer component to be disconnected prior to removal of the component from an access port. Actuation of a latch enables an operator to move the interlock away from the access port of a computer housing. Movement of the interlock away from a computer housing removes communication of the interlock with a power switch of the associated access port and thereby removes power to the associated access port. In addition, movement of the interlock away from the housing enables an operator to remove and/or place a component in the access port. Similarly, proper placement of the interlock in front of the access port places the interlock in communication with a power switch of the associated access port and provides power to the associated access port, and prevents actuation of an ejection lever of the access port.

19 Claims, 3 Drawing Sheets

INTERLOCK FOR BLIND DOCK CARTRIDGE

BACKGROUND OF THE INVENTION

1. Technical Field

This invention relates to an apparatus to control movement of a computer cartridge. More particularly, the invention relates to an interlock for controlling power delivery to the computer cartridge.

2. Description of the Prior Art

The increased dependency on processor based machines, also known as computers, has resulted in a need for such machines to be serviced while performing regular functions. A typical computer system includes a main board, also referred to as a "motherboard", with a plurality of access ports adapted to receive computer modules to expand the capacity and functionality of the computer. The demand for reliability in computer systems has led to the development of computer systems that support hot swapping of computer modules, including cards such as a PCI card. This procedure allows a computer system to continue operating while a card is removed from the computer system or while a new card is inserted into the computer system. When one card is found to have a defective component or otherwise requires removal, the computer system can continue to function while the card is in the process of being removed, installed, or replaced. Accordingly, the process of hot swapping enables system components on any one of the cards to be removed, installed, or replaced without shutting down power from the computer system.

The process of hot swapping computer cards requires that power be removed from the card prior to removal from or insertion into the associated access port. Cards that are inserted into an access port using the hot swapping process are occasionally inserted into a carrier, also known as a cartridge. The carrier is inserted into the chassis of the computer system. Thereafter, an ejection lever for the carrier holding the card is closed and the card is seated into the associated connector of the access port. One problem associated with hot swapping computer cards is the inadvertent removal of the card carrier while the card is in operation. The current design of carriers does not provide a means to prevent extraction of the carrier from the module while the card is in an active state. When the card is removed or in the process of being removed while it is in an active state of operation, the power will not have been properly discontinued from the card prior to removal of the card from the access port and associated connector. Removal of the computer card from the access port while the computer card is operating can have serious consequences on the integrity of the card as well as operation of the computer system. For example, the system is likely to continue waiting on an uncompleted process involving the inadvertently removed card. Accordingly, the prior art systems provide the ability to hot swap computer cards without providing adequate safety measurements to ensure proper card deactivation prior to removal.

One form of securing a computer card is shown in U.S. Pat. No. 6,069,796 to Hastings et al. The '796 patent discloses a clamp for securing a card in an access port of a computer. The clamp pivots about a bearing adjacent to a top area of the access port. The clamp determines whether a power switch for the accompanying access port is activated. The clamp is designed to be depressed by an operator when the operator needs to access the access port. The act of depressing the clamp rotates the clamp and releases power from the access port. Similarly, when the clamp is in place, power is provided to the access port. Actuation of the clamp controls the provision of power to the access port as well as exerts a force on the surface of the card adjacent to the access port. However, the Hastings et al. patent does not provide a housing that is independent of both an actuation apparatus and the card to control placement of the card in the access port. Accordingly, the clamp in combination with the power switch does not provide the ability to control access and power to the card independent of exerting force on the card.

There is therefore a need for an apparatus and method for controlling access and power to a computer card by controlling improper actuation of a carrier for a computer card.

SUMMARY OF THE INVENTION

This invention comprises an interlock housing for a computer. The housing controls access and delivery of power to a computer component prior to removal from an associated access port.

A first aspect of the invention is apparatus including a housing for a computer that protrudes over an access port. The housing extends from a release device for a component within the access port an opposite end of the access port. A blade is provided to interface with a power switch for the access port. The housing preferably includes a first aperture adjacent to the blade to view a power indicator of the access port, and a second aperture to enable access to the component. An open position of the housing preferably places the switch in an off position, and a closed position of the housing preferably places the switch in an on position. In addition, the housing may include a latch to control movement of the housing. A release of the latch from a flange of the access port preferably enables an operator to actuate the housing and to control placement of the component with respect to the access port, and an engagement of the latch with the flange of the access port prevents actuation of the housing.

A second aspect of the invention is a method for controlling access to an access port of a computer. A housing is projected over the access port, and power is delivered to a component within the access port. The housing extends from a release device for a component within the access port to an opposite end of the access port. The housing may be moved away from the computer. The step of moving the housing away from the computer preferably removes power from the access port. The housing may include a latch for controlling movement of the housing with respect to the access port. The step of actuating the latch may include releasing the latch from a flange of the access port to control placement of the component with respect to the access port, and engaging the latch with a flange of the access port to prevent removal of the component from the access port.

Other features and advantages of this invention will become apparent from the following detailed description of the presently preferred embodiment of the invention, taken in conjunction with the accompanying drawings.

DESCRIPTION OF THE PREFERRED EMBODIMENT

Overview

Computers and the associated motherboards are generally designed with a plurality of connectors for receiving computer modules such as cards. In general, most motherboards have the connectors aligned in a specific area. The computer case is complementary to the design of the motherboard so that the connectors of the motherboard are accessible from a specific area of the case. This enables an operator to hot swap computer cards without removing the case and exposing the motherboard. Alternatively, this enables an operator to secure any required accessories to a receiving end of the card. With recent advances, computer modules such as cards can be inserted into or removed from the motherboard through a hot swapping process, which enables insertion and removal of cards while the computer continues operation. In addition, the cards may be inserted and/or removed from the appropriate access port of a computer motherboard using a "blind dock cartridge", which is a carrier for the card in which the connection direction is perpendicular to the direction of insertion. Computer card carriers are arranged in such a manner that it is not uncommon to inadvertently remove a card that is still in operation in place of a card that has had power removed therefrom in anticipation of removal from the motherboard.

Technical Details

Figure 1:
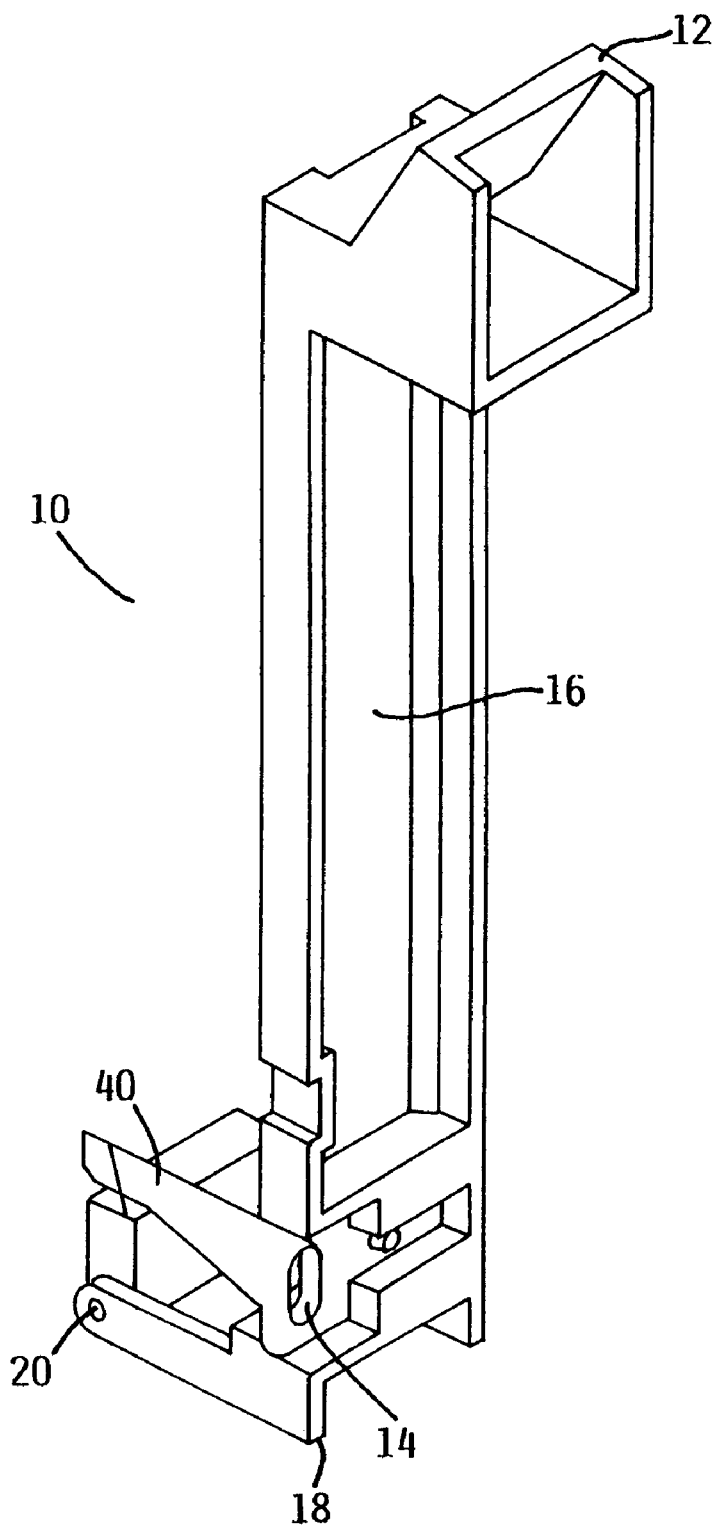
FIG. 1 is a perspective view of a in interlock housing taken from the left side, and is suggested for printing on the first page of the issued patent.

FIG. 1 is a perspective view of the interlock 10 independent of a computer housing. The interlock 10 is an elongated structure adapted to extend lengthwise over an exterior surface of an access port of a computer. A top portion 12 of the interlock 10 is angled with a downward slope and is adapted to be placed upright in contact with an ejection lever 30, also known as a release device, of the access port. When the interlock 10 is properly mounted upright to the computer housing, the ejection lever 30 rests on the top surface 12 of the interlock 10, which prevents movement of the ejection lever 30. A bottom portion of the interlock 10 has a hinge 20 adapted to secure the interlock 10 to the computer housing. Adjacent to the bottom portion of the interlock 10 is a blade 40 adapted to communicate with a switch 60 on the computer board 70 and to control delivery of power to the associated access port. A front portion of the interlock 10 has two apertures 14 and 16. A first aperture 14 is mounted adjacent to the blade 40. The first aperture 14 enables an operator of the interlock 10 to view a power indicator of the access port. The second aperture 16 is mounted between the top portion 12 and the bottom portion 18 of the interlock 10, and enables access to a carrier and associated card mounted in the access port. For example, the second aperture 16 may be adapted to enable communication with a cable connection of the card. Accordingly, the interlock 10 is a longitudinal structure adapted to be placed lengthwise over an exterior surface of an access port of a computer to prevent improper removal of a card and/or a card mounted in the carrier from an associated access port.

Figure 2:
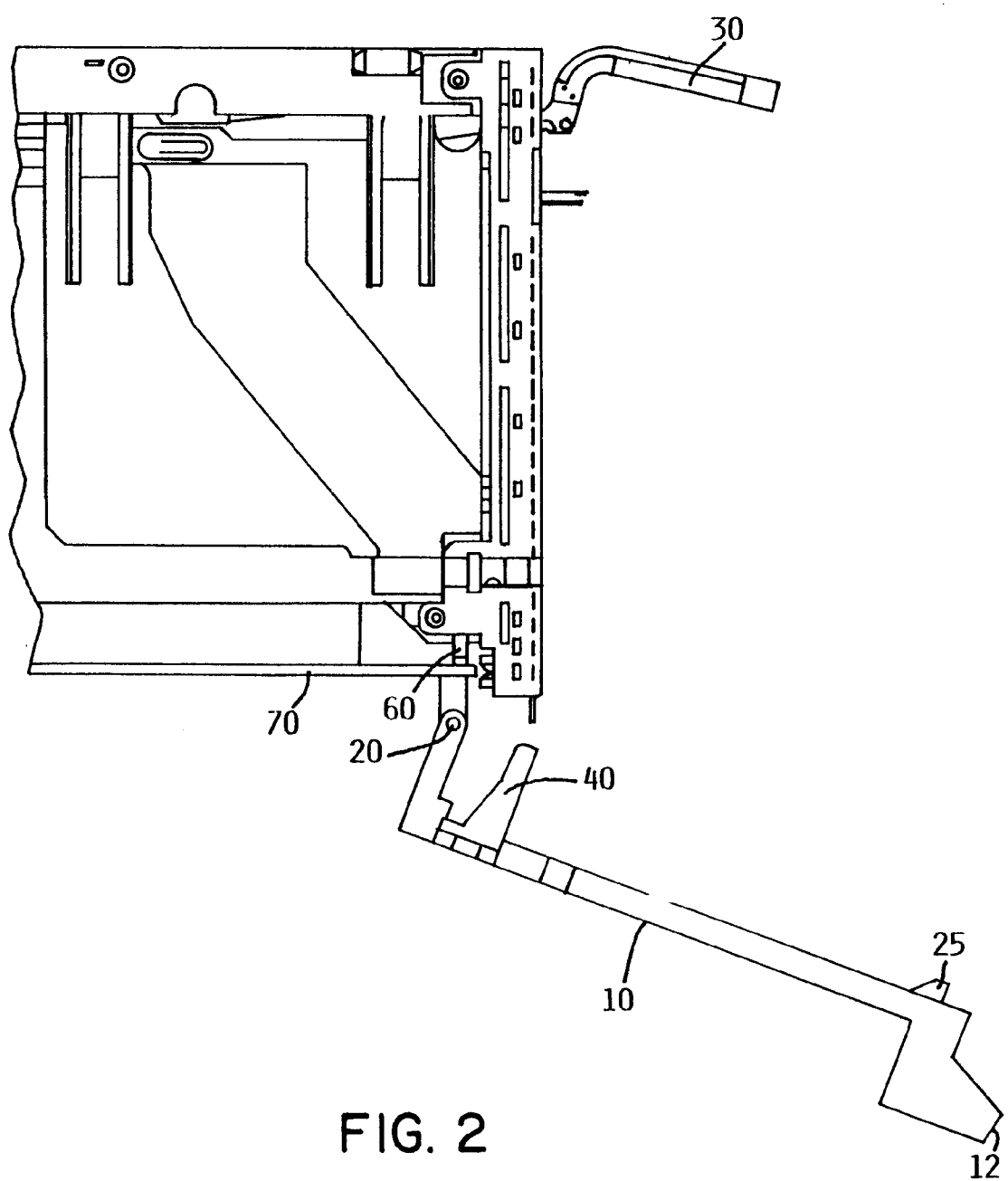
FIG. 2 is a side view of an interlock housing in an open position.

FIG. 2 is a side view of the interlock 10 in an open position. The hinge 20 is secured to the board 70 of the computer. The interlock includes a latch 25 on an interior surface thereof adjacent to the top portion 12 of the interlock 10. The latch 25 controls placement of the interlock 10 in an open or closed position. The latch 25 is adapted to be received by a flange 27 from a card bulkhead panel. When the latch 25 is released, the interlock 10 may be rotated about the hinge 20, to remove the interlock 10 from the computer housing. The rotation of the interlock 10 enables an operator to move the interlock 10 about the axis of the hinge 20 and to enable an operator to place, remove, or otherwise control placement of a card and/or card mounted in a carrier with respect to the access port. The process of moving the interlock 10 away from the front of the access port moves the blade 40 away from a power delivery position and to a power removal position. As shown in FIG. 1, the blade 40 is a part of the interlock 10. As the interlock 10 rotates about the hinge 20 from a closed position to an open position, communication of the blade 40 with the switch 60 changes. The switch 60 is mounted on a top surface of the board of the computer adjacent to the position of the hinge 20. The switch 60 communicates power delivery to the access port. As shown in FIG. 2, when the interlock 10 is removed from the front of the access port along the axis of the hinge 20, the interlock 10 is rotated away from the housing and communication of the blade 40 with the switch 60 is discontinued and delivery of power to the access port ceases. Accordingly, the latch 25 functions to secure the interlock 10 to the computer housing and to prevent movement of the interlock 10 with respect to the housing when the latch 25 is engaged with the flange 27.

Figure 3:
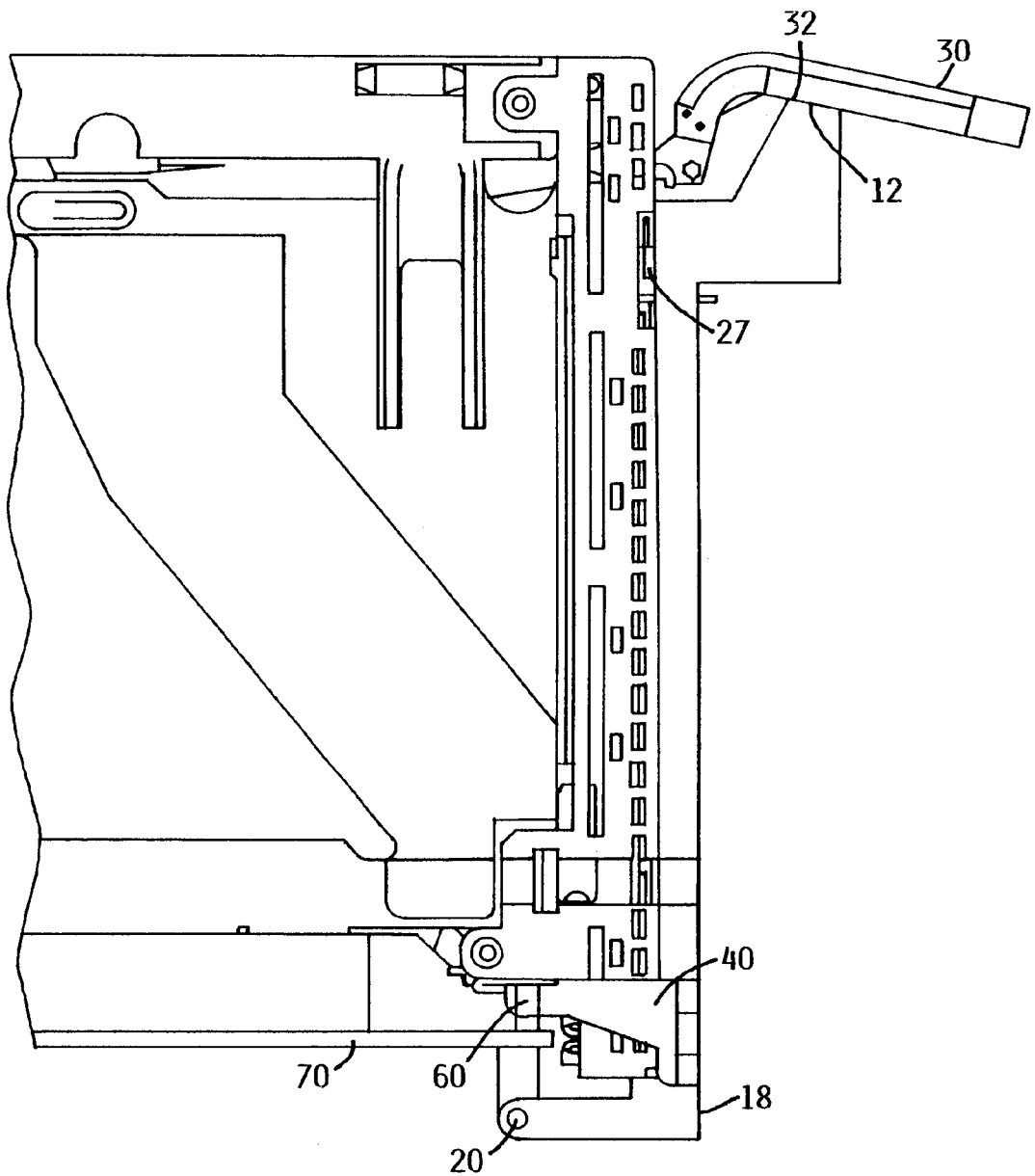
FIG. 3 is a side view of an interlock housing in a closed position.

FIG. 3 is a side view of the interlock 10 in a closed position. The latch 25 (not shown) is engaged with the flange 27 of the housing. In the closed position, the ejection lever 30 of the access port is in contact with the interlock 10 and may not be actuated into a position to eject the module from the access port. A rest position of the ejection lever 30 has a slight downward slope. The top surface 12 of the interlock 10 is shaped with a downward slope to engage a bottom surface 32 of the ejection lever 30. Therefore, the interlock 10 does not enable downward pressure of the ejection lever 30 to eject a component from the access port, nor does the interlock 10 exert a pressure of sufficient strength so as to move the ejection lever 30 from it's rest position. In addition, when the interlock 10 is in the closed position, the blade 40 is in a communication with the switch 60 and power is delivered to the associated access port. Accordingly, the closed position of the interlock 10 prevents the ejection lever 30 of the housing from removing a card and/or a card mounted in a carrier from the access port and communicates delivery of power to the component housed within the access port.

Advantages Over the Prior Art

The interlock provides an apparatus to remove power from an access port prior to enabling removal of a card and/or a card mounted in a carrier from the access port. In addition, the configuration of the interlock does not enable removal or placement of a card and/or a card mounted in a carrier in the access port when the interlock is in an upright and operating position. The interlock functions both as a physical barrier to enable access to the port as well as a communication source for controlling delivery of power to the associated access port. Accordingly, the interlock functions as a physical barrier for a computer module as well as a power delivery tool for controlling delivery of power to the connector associated with the access port prior to removal of the card and/or card mounted in the carrier, and prior to damage to the card, motherboard, and/or connector contacts.

Alternative Embodiments

It will be appreciated that, although specific embodiments of the invention have been described herein for purposes of illustration, various modifications may be made without departing from the spirit and scope of the invention. In particular, the switch 60 in the preferred embodiment is an optical switch. However, the switch may also be in the form of a magnetic read switch, in which the blade 40 has a magnet mounted thereon. When the blade 40 is in a raised position, the magnetic read switch ceases sending power to the access port. Similarly, when the blade 40 is in a lowered position, the magnetic read switch delivers power to the access port. In addition, the switch 60 may be a mechanical switch in which the blade 40 presses on a contact or electric charge to communicate with the power supply of the access port. In the preferred embodiment, the switch 60 is shown mounted on a top surface of the board. However, the switch 60 may be placed in other locations, such as mounted to the bottom of the board or the chassis of the computer. The switch needs to be placed in a location that enables the position of the interlock to control access to and delivery of power to the associated access port. Furthermore, movement of the interlock with respect to the computer housing is not limited to rotating the interlock about the axis of the hinge as illustrated. The hinge may be replaced with an alternative connection element which enables the interlock to be rotated or translated away from the housing, or one which provides for complete removal of the interlock from the housing. In addition, the hinge 20 is shown secured to the board 70. However, the hinge 20 may be secured to the chassis of the computer or to the carrier. Accordingly, the scope of protection of this invention is limited only by the following claims and their equivalents.

I claim:

1. An interlock apparatus comprising:
    a body to protrude over an access port of a computer, wherein said body extends from a release device for a component within said access port to an opposite end of said access port; and
    a blade integral to said body to interface with a power switch for said access port.

2. The apparatus of claim 1, wherein said body further comprises a first aperture adjacent to said blade to view a power indicator of said access port.

3. The apparatus of claim 1, wherein said body further comprises a second aperture to enable access to said component.

4. The apparatus of claim 1, wherein an open position of said body places said switch in an off position.

5. The apparatus of claim 1, wherein a closed position of said body places said switch in an on position.

6. The apparatus of claim 1, wherein said body further comprises a latch to control actuation of said body.

7. The apparatus of claim 6, wherein a release of said latch from a flange of said access port enables an operator to actuate the body and to control placement of said component with respect to said access port.

8. The apparatus of claim 6, wherein engagement of said latch with a flange of said access port prevents actuation of said body.

9. The apparatus of claim 6, wherein actuation of said body is selected from the group consisting of; rotating, removing, translating, and combinations thereof.

10. A method for controlling access to an access port of a computer, comprising:
    (a) projecting an interlock over said access port of said computer, wherein said interlock extends from a release device external to said access port to an opposite end of said access port; and
    (b) delivering power to said access port.

11. The method of claim 10, further comprising the step of moving said interlock away from said computer.

12. The method of claim 11, wherein the step of moving said interlock away from said computer includes removing power from the access port.

13. The method of claim 10, further comprising the step of actuating a latch of said interlock for controlling movement of said housing with respect to said access port.

14. The method of claim 13, wherein the step of actuating said latch includes releasing said latch from a flange of the access port and controlling placement of said a component with respect to said access port.

15. The method of claim 13, wherein the step of actuating said latch includes engaging said latch with a flange of the access port and preventing removal of a component from said access port.

16. The method of claim 11, wherein the step or moving of said interlock is selected from the group consisting of: rotating, removing, translating, and combinations thereof.

17. A computer comprising:
    an interlock to protrude over an access port of said computer, wherein said interlock extends from a release device to an opposite end of said access port;
    a blade integral to said interlock to interface with a power switch for said access port; and
    a latch to control actuation of said interlock.

18. The computer of claim 17, wherein an open position of said interlock places said switch in an off position.

19. The computer of claim 17, wherein a closed position of said interlock places said switch in an on position.

* * * * *

UNITED STATES PATENT AND TRADEMARK OFFICE
CERTIFICATE OF CORRECTION

PATENT NO. : 6,678,162 B2
DATED : January 13, 2004
INVENTOR(S) : Chewning

It is certified that error appears in the above-identified patent and that said Letters Patent is hereby corrected as shown below:

Underline: Title page,
Item [54], Title, should read -- INTERLOCK FOR A BLIND DOCK CARTRIDGE --

Signed and Sealed this

Ninth Day of March, 2004

JON W. DUDAS
*Acting Director of the United States Patent and Trademark Office*